(12) United States Patent
Houis

(10) Patent No.: US 12,306,217 B2
(45) Date of Patent: May 20, 2025

(54) CURRENT SENSING WITH POSITIONING STABILITY

(71) Applicant: Melexis Technologies SA, Bevaix (CH)

(72) Inventor: Simon Houis, Bevaix (CH)

(73) Assignee: Melexis Technologies SA, Bevaix (CH)

( * ) Notice: Subject to any disclaimer, the term of this patent is extended or adjusted under 35 U.S.C. 154(b) by 262 days.

(21) Appl. No.: 18/070,953

(22) Filed: Nov. 29, 2022

(65) Prior Publication Data

US 2023/0204632 A1 Jun. 29, 2023

(30) Foreign Application Priority Data

Dec. 28, 2021 (EP) ..................................... 21217901

(51) Int. Cl.
  *G01R 19/00* (2006.01)
  *G01R 15/20* (2006.01)
(52) U.S. Cl.
  CPC ....... *G01R 19/0092* (2013.01); *G01R 15/202* (2013.01)
(58) Field of Classification Search
  CPC ... G01R 19/0092; G01R 15/202; G01R 15/20
  See application file for complete search history.

(56) References Cited

U.S. PATENT DOCUMENTS

| | | | | |
|---|---|---|---|---|
| 10,877,075 B2 * | 12/2020 | Okuyama | ............ | G01R 15/205 |
| 2010/0259255 A1 | 10/2010 | Ashio et al. | | |
| 2015/0204916 A1 | 7/2015 | Akimoto et al. | | |
| 2017/0285075 A1 * | 10/2017 | Okuyama | ............ | G01R 33/093 |
| 2017/0285076 A1 | 10/2017 | Okuyama et al. | | |

FOREIGN PATENT DOCUMENTS

| | | | |
|---|---|---|---|
| DE | 10243645 A1 | | 6/2004 |
| JP | 2006184269 A | | 7/2006 |
| JP | 2020139899 A | * | 9/2020 |

OTHER PUBLICATIONS

European Search Report for Corresponding EP Application 21217901.4, Jun. 30, 2022.

* cited by examiner

*Primary Examiner* — Paresh Patel
(74) *Attorney, Agent, or Firm* — Workman Nydegger

(57) ABSTRACT

A sensing system is provided for contactless sensing of current. The system includes a conductor for generating a magnetic field as electric current flows through the conductor, the conductor having a predetermined width and comprising a hole with a predetermined hole width passing through the whole thickness of the conductor, and a magnetic sensor for measuring at least one component of the magnetic field generated by the conductor. The magnetic sensor overlaps the hole. The current sensing is done based on the measured magnetic field. The sensor is positioned at a predetermined distance over a top surface of the conductor. The width of the hole is at least 0.15 times the width of the conductor.

17 Claims, 9 Drawing Sheets

CURRENT SENSING WITH POSITIONING STABILITY

FIELD OF THE INVENTION

The invention relates to the field of current sensing. More specifically it relates to contactless sensing of currents flowing through a conductor.

BACKGROUND OF THE INVENTION

Current sensing on bus bars is an important issue in power engineering. For example, in automobile industry, energy generation and battery-management systems require a careful monitoring of electric power generated, distributed, and stored by the vehicle. An approach for current sensing involves the implementation of contactless current sensors. These sensors usually operate by detecting the magnetic field generated by current flowing through the bus bar. The sensing elements generate a signal dependent on the magnetic field to which the sensing element is exposed. From this signal, it is possible to calculate the electric current intensity flowing through the bus bar.

Due to the nature of the magnetic field and the potential influence of environmental magnetic noise, the signal-to-noise ratio is an important parameter to increase in these sensors. This is done by positioning the sensing element very close to the bus bar, in order to reduce the influence of environmental magnetic noise, and also to increase the magnetic signal, since the magnetic forces are heavily reduced by the distance. The bus bar can also be adapted by adding a necking near the sensing area, so the magnetic field generated by the conductor is locally increased around the necking. However, for repeatability and reliability, careful calibration is required, which is difficult and time consuming.

SUMMARY OF THE INVENTION

It is an object of embodiments of the present invention to provide a contactless sensing system for providing a stable reading of current through a conductor, where the system has high mechanical tolerances, and a method of setting such system wherein there is no need of time-consuming positioning and calibration. It is a further object to provide a kit of parts including the conductor and a sensor.

In a first aspect, the present invention provides a sensing system for contactless sensing of current passing through a conductor. The system includes a conductor for generating a magnetic field as electric current flows through the conductor, the conductor having a predetermined width comprising a hole with a predetermined hole width passing through the whole thickness of the conductor, and a magnetic sensor for measuring at least one component of the magnetic field generated by the conductor. The magnetic sensor overlaps the hole. The current sensing is done based on the measured magnetic field. The sensor is positioned at a predetermined distance over a top surface of the conductor. The width of the hole is at least 0.15 times the width of the conductor. The sensor is centered relative to the hole, so the center axis of the hole overlaps the sensor, for example crosses the center of the sensing area of the sensor.

It is an advantage of embodiments of the present invention that tolerances of sensor positioning are improved. It is a further advantage that static and dynamic mechanical tolerances are increased, thus reducing the need of calibration in the production line and reducing the influence of vibration and lifetime mechanical drift.

In some embodiments of the present invention, the sensor includes at least one magnetic sensing element. In particular, the sensing element overlaps the hole of the conductor.

It is an advantage of embodiments of the present invention that highly sensitive sensing elements can be used.

In some embodiments of the present invention, the sensor comprises a molded integrated circuit and leads, where the molded integrated circuit is separately provided over the conductor. It is an advantage that a modular system can be provided.

In some embodiments of the present invention, the sensor is positioned between 1 mm and 6 mm away from the conductor.

It is an advantage of embodiments of the present invention that a compact design can be obtained while providing good mechanical stability.

In some embodiments of the present invention, the sensor is adapted to measure a difference of the field between two different positions.

It is an advantage of embodiments of the present invention that the measurement of field gradients is robust against external magnetic fields.

In particular, the sensor can be adapted to measure a difference of the field between two positions in perpendicular direction with respect to the surface of the conductor.

In particular embodiments, a central axis can be defined in the hole, and the sensor further comprises at least two sensing elements distanced within a plane parallel to the conductor surface, the central axis of hole passing through the mid-point between the two sensing elements.

However, the present invention is not limited to measuring differential fields. For example, a component of the field may be measured. For example, the X component of the field, perpendicular to the direction of the current and to the axis of the hole, may be measured. This configuration advantageously simplifies the components, as only one sensing element may be required, and also may simplify data treatment of the signal. Moreover the measurement of the X component presents high mechanical tolerances.

In some embodiments of the present invention, the sensing system further comprises a magnetic shield at least partially surrounding the conductor portion comprising the hole. In some embodiments, the magnetic shield has a U-shape.

It is an advantage of embodiments of the present invention that mechanical tolerance is further improved.

In some embodiments of the present invention, the sensor is adapted to provide reading of alternating current.

It is an advantage of embodiments of the present invention that at least one component of the field is robust against frequency-dependent attenuation.

In some embodiments of the present invention, the hole is centered with respect to the conductor cross section.

In some embodiments of the present invention, the conductor has a rectangular cross section and a thickness of 1 mm up to 5 mm.

In some embodiments, the conductor has a width between 3 mm and 20 mm.

In a further aspect, the present invention provides a method of measuring current through a conductor, including providing a hole through the conductor, providing a magnetic sensor overlapping the hole at a predetermined distance from the hole opening, wherein providing the hole comprises providing the hole with a width of at least 0.15 times the width of the conductor.

It is an advantage of embodiments of the present invention that a contactless sensor with high mechanical tolerances which reduce or remove the need of accurate positioning and calibration during manufacture. It is a further advantage that mechanical tolerances during the lifetime of the device are also increased.

In some embodiments of the present invention, providing the hole comprises stamping the conductor.

It is an advantage of embodiments of the present invention that no complex and time-consuming shaping or cutting methods are required for providing such hole on the bus bar. It is a further advantage that such method is compatible with typical bus geometries where the width of the bus is larger than the bus thickness (w> t) and with a suitable hole geometry where the hole width is larger than the bus thickness (whole> t).

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
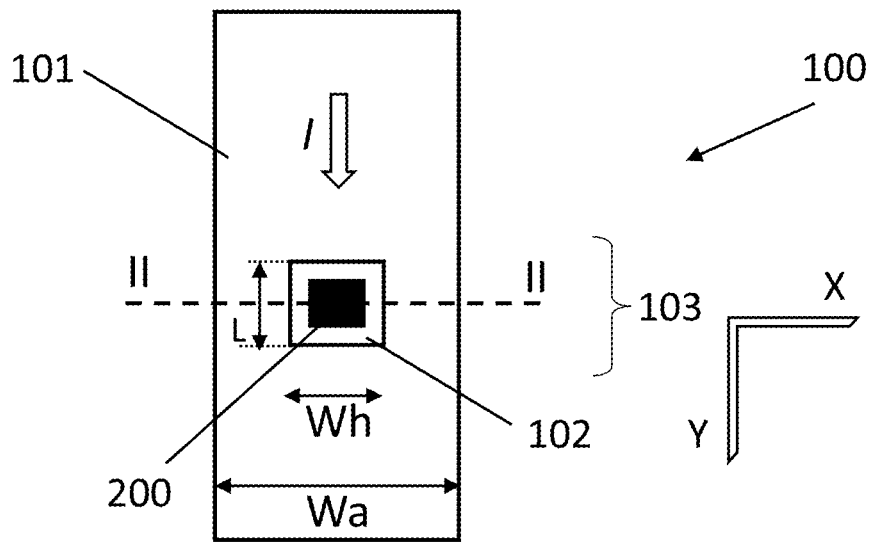
FIG. 1 illustrates a bottom view of a conductor including a hole, where the sensor overlaps the hole, in accordance with embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "hole", reference is made to an orifice through the whole thickness of a body, where the hole is surrounded by the material of the body except of on the two openings of the hole on opposite surfaces of the body. In embodiments of the present invention, the body is a conductor, usually a flat conductor such as a bus bar. A hole in the conductor is different of a necking or notch in the conductor. Topologically speaking, a conductor with one hole is a genus-1 surface.

In many instances, it is required to measure the amount of current through a conductor, for example on circuit substrates (PCB) or conductors external to boards, such as bus bars or the like. The type of application usually defines the type of conductor; e.g. for measuring currents which are estimated over 30 A, bus bars are generally preferred. The type of application includes, but it is not limited to, electricity generation, electric storage and management (e.g. in automotive industry), and/or electric distribution in buildings or the like. The current generates a magnetic field, which can be detected by one or more magnetic sensing element. For example, at least one component of the magnetic field can be measured, depending on the type and number of sensing elements used. The sensing element generates a signal proportional to the magnetic field detected, which in turn is proportional to the current through the conductor. Thus, it is possible to obtain the current through a conductor by measuring the field generated by it. Such current sensors are contactless current sensors, as they do not need to touch or otherwise mechanically interact with the conductor.

Clearly, the measurement of the current depends on the quality of the magnetic field measurement. The magnetic signal from the conductor should be high compared to the noise (high signal-to-noise ratio, SNR) and the magnetic stray fields should affect the magnetic signal as little as possible. Merely placing the sensor very close to the conductor is not enough.

Existing solutions include necking of the conductor. Since the sensor captures the field through a small portion (probing portion) of the conductor, reducing the cross section of the conductor would increase the current locally, thus increasing the magnetic field generated by it, without affecting the overall electric signal through the conductor in a meaningful way.

However, positioning of the sensor must be very accurate, and a costly and time-consuming calibration is required. Moreover, in some applications, the sensor may displace due to e.g. vibrations or the like, during the lifetime of the device.

The present invention provides a sensing system where the sensor placement requirements over the probing portion are relaxed. This means that calibration requirements are also relaxed. The advantages stretch beyond production stages, as the mechanical stability of the system improves during the lifetime of the system. Measurement of AC signals suffers less attenuation.

The present invention provides a system where the so-called probing portion divides the conductor in two separate parts, where the current passes with the same direction and substantially the same intensity through both. In other words, the probing portion of the conductor includes a hole. The sensor is placed over the hole, overlapping it. For example, the sensor is placed at the same distance from each part of the conductor.

Each part of the conductor acts as a smaller conductor that generates a magnetic field around it, which interacts with the field generated around the other part of the conductor. The field inside the hole is very strong, so to obtain a good signal, with high SNR, the measurement would be done inside the hole. However, the present invention provides the opposite: the sensor is placed outside the hole, at a predetermined distance which depends on the characteristics of the conductor. For example, the separation of the two parts, given by the width of the hole, is tuned so that there is a region over the hole, at a predetermined distance from the conductor, at which the measurement of the field has a very low sensitivity relative to the position where the measurement is being performed, within that region. Where in embodiments of the present invention reference is made to 'stability region', reference is made to the region where the signal varies a maximum of 4%, for example 3%, for example 2%, for the same current (the variation stemming, thus, from sensor positioning).

While the prior art necking increases SNR by reducing the cross section of the probing portion, a misplacement of 1 mm of the sensor over the intended position (e.g. for measurement of the field gradient) can result in up to 30% deviation from the correct signal. To solve this, an accurate calibration is required, and vibrations or misplacements during the lifetime of prior art systems can cause drift. The inventors found that in embodiments of the present invention, although there is a reduction of the magnetic signal due to the relatively large hole width required, the stability region is sizeable enough so that there is reduced calibration requirements, or even no need to calibrate. Since the stability region depends on the shape of the probing portion of the conductor, the influence of vibrations and/or displacements are reduced during the lifetime of the system.

In a first aspect, the present invention relates to a sensing system for contactless current sensing. The system includes the conductor which, when operative, carries the current to be sensed. It also includes a magnetic sensor for sensing the magnetic field locally around the conductor, in the probing portion of the conductor, for example at least one component of the magnetic field. The magnetic sensor can provide a signal based on the sensed field. Since the signal is based on the magnetic field, and the magnetic field is generated by the current through the probing portion of the conductor, the signal from the magnetic sensor can be used to provide a (magnetic, thus without contact, or contactless) measurement of the electric current through said conductor.

In the probing portion, the conductor is divided in two parts which generate substantially the same magnetic field around them, for example the same current pass through each part. The parts are sufficiently separated to provide a magnetic field where a relatively large stability region. Each part of the conductor may for example be made of the same material, and it may be for example the same material as the rest of the conductor. For example, each part may be thinner than the rest of the conductor outside the probing portion. In particular embodiments, the conductor includes a through-hole separating the conductor in the two parts in the probing portion. In this case, the width of the hole is adapted to provide the required sufficient separation, taking into account SNR, and based on parameters of conductor, e.g., the specific shape of the probing portion.

The characteristics of the sensor are such that the sensing element or elements can provide a signal based on the field within the stability region. The magnetic sensor is positioned over the conductor, away from the hole, at a predetermined distance so the magnetic sensing element or elements fit within the stability region which is generated over the zone between the two conductor parts (e.g., over the hole in the conductor probing portion).

FIG. 1 shows the bottom view of an embodiment of the system 100 of the present invention including an elongated conductor 101 where the probing portion 103 includes a hole 102, e.g., only one hole 102, where the center of the hole crosses the longitudinal central axis of the elongated conductor 101. The conductor 101 may be for example a bus bar. The current I flows in the longitudinal direction of the elongated conductor 101 as indicated by the arrow.

In some embodiments, the conductor 101 through the probing portion 103 has the same width (between the external edges thereof) as the rest of the conductor 101. In some embodiments, the conductor 101 through the probing portion has straight edges, as there is no need of necking, notches, or the like. In other words, there is no necking on the probing portion of the conductor. This improves the mechanical robustness of the conductor and since no necking needs to be provided, the manufacture is simplified.

A magnetic sensor 200 is provided over the probing portion. The magnetic sensor 200 overlaps the hole 102, preferably centered over the axis of the hole. In particular the sensor includes one or more sensing elements, which are positioned close to the center of the hole. For example, if there is one sensing element, its position can overlap the center of the hole 102, for example for a plurality of sensing elements (e.g. two), the mid-point between the sensing elements coincides with the center axis of the hole if there are a plurality of sensing elements. The region or area (as projected from the top view) of the sensor which receives the signal to be read can be defined as the sensing area. Where it is said that the sensor is centered with the center axis of the hole, it is meant that the sensor sensing area is centered with the axis of the hole 102. The sensing area of the sensor is delimited by the sensing elements. If there is one sensing element, the area (as projected from the top view) of the sensing element itself is centered with the axis of the hole. If there is a plurality of sensing elements, a figure can be formed with its vertices at the center of each sensing element. The center of the sensing area enclosed by such figure is aligned with the axis of the hole. Thus, a single sensing element would be equidistant to each part of the conductor, where the hole 102 has one part 104, 105 of the conductor at each side. For a plurality of sensing elements as explicitly shown in FIG. 2, the distance of each sensing element 201, 202 to the part 104, 105 of the conductor being closest to the respective sensing element is roughly the same (thus, the sensing element 201 at the left is at a given distance to the left part 104 of the conductor, and the sensing element 202 at the right is at the same given distance to the right part 105 of the conductor).

The magnetic sensor 200 may be an integrated circuit. The magnetic sensor may include at least one magnetic sensing element. Magnetic sensing may be based on magneto-resistance, Hall sensing elements, or any other suitable sensing technique which can generate a readable signal based on (and proportional to) the magnetic field. In some embodiments, at least one Hall element is used. This type of sensing provides effective, sensitive measuring with little power consumption.

Figure 2:
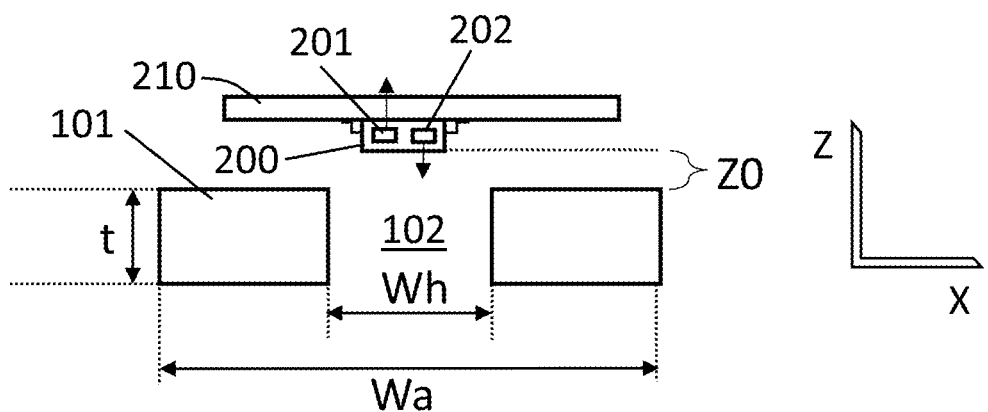
FIG. 2 illustrates a cross section of the probing portion of the system in accordance with embodiments of the present invention.

The magnetic sensor may be for example a molded IC including leads and the like, as shown in FIG. 2. In particular, the sensor 200 of FIG. 2 is differential sensor comprising two sensing elements 201, 202 overlapping the hole 102. The typical separation between the sensing elements may be between 1 mm and 3 mm.

Such magnetic sensor 200 may be provided on a substrate 210 including conductive tracks or the like for outputting the signal from the IC to a memory, display, controller, processor, or the like. The substrate 210 may be for example a printed circuit board (PCB). The substrate 210 and sensor 200 may be separate and distanced from the conductor, thus advantageously providing a modular system. The substrate 210 could also be disposed up-side down, for example, the PCB can be mounted on the conductor. For example, the conductor with the correct sized hole may be provided separately from the sensor. A simple guiding system may be provided adjusted to the hole to lock the positioning of the sensor. During assembly, the sensor 200 needs to be at a predetermined distance from the hole 102, overlapping it, in particular the magnetic sensing elements 201, 202 overlap the hole 102, but the mechanical tolerances are so high that the positioning may be done with an accuracy of, for example, millimeters, thus improving the margin of error and a complex calibration is not needed. Since the assembly is easy, without requiring complex calibrations, the system can be provided to the end user or the installer as separate pieces in a secure way, and it can be assembled in situ, e.g. during assembly of the structure to which the system belongs (e.g. a vehicle). However, the present invention is not limited thereto. In some embodiments, the conductor may be integrated or part of the same substrate where the sensor is provided. For example, the conductor may be part of the substrate, so the conductor and magnetic sensing elements may be molded together.

FIG. 1 and FIG. 2 indicate that the Y direction is the direction of the current, the Z direction is the direction of the hole, or in other words the direction perpendicular to the plane of the conductor surface (in conductor portions away from the probing portion), and the X direction is perpendicular to the other two directions. In case of the conductor of FIG. 1 and FIG. 2, the X direction is the direction of the width Wh of the conductor, the Y direction is the direction of the current and the Z direction is perpendicular to both, in the direction of the thickness of the conductor. The rest of the disclosure will follow the same orientation system.

The particular geometry of the probing portion of the conductor plays a role in the generation of the region where mechanical tolerances are relaxed and robustness towards mechanical displacements is improved, in particular the distance Z0 between the region and the opening of the hole. This region determines the place where the sensor (more in particular, the position of the sensing elements) should be placed, relative to the conductor.

In order to provide, over the hole, a large enough stability region to fit the sensing elements, the separation of the two conductor parts (given by some dimensions of the hole, in particular Wh) needs to be adapted and tuned.

The length L of the hole (i.e. along the current direction) may be between 0.5 Wh and 2 Wh, or between 0.3 Wh and 3 Wh. For example, the length of the hole may be equal to Wh, for a square hole. In some embodiments, L is at least 1 mm, or at least 2 mm, at least 3 mm, and/or 4 mm, or 5 mm, or 6 mm. The width Wh of the hole is at least 0.15, for example at least 0.2 times the width Wa of the conductor, so the hole width is at least 15% of the width of the conductor, or 20% the width of the conductor or more, for example at least 30%, for example at least 35%, for example at least 40%, for example at least 45%, for example at least 50%. In some embodiments of the present invention, these hole dimensions result in a relatively large hole opening area, which could in theory fit the magnetic sensor 200. However, the sensor, and in particular its sensing elements, are situated outside the conductor 101, at a predetermined distance from the plane defined by the surface of the conductor 101, as shown in the following FIG. 2. For example the sensing elements are positioned in a plane parallel to the conductor surface (in other words, parallel to the opening of the hole).

FIG. 2 shows the cross section II-II of the system as indicated in FIG. 1. The cross section of the probing portion of the conductor 101, being a bus bar, is rectangular with a predetermined width Wa and thickness t. The two parts 104, 105 are then separated by a distance equal to the hole width Wh. The hole 102 may be arranged so that the magnetic field generated by the conductor parts 104, 105 at two opposite sides of the hole is substantially symmetrical with mirror symmetry. For example, the hole 102 may be centered with respect to a cross section X-Z of the conductor, so it crosses the longitudinal axis of the conductor. For example, the hole may effectively separate the conductor 101 in two parts 104, 105 as explained earlier, with equal cross section area, so the current through the conductor is divided in two halves, each flowing through one part 104, 105 of the conductor. The magnetic field above the hole includes a region within which a magnetic sensor experiences less impact from mechanical tolerances.

This region is outside the hole 102, positioned at a predetermined distance Z0. The distance between the sensing element(s) and the plane of the conductor surface should be around Z0. In other words, the distance from the longitudinal axis at the center of the conductor 101 to the opening of the hole (in FIG. 2, t/2) is smaller than the distance from the longitudinal axis at the center of the conductor 101 to the sensing element (or to the closest sensing element) of the magnetic sensor 200 (in FIG. 2, t/2+Z0). Z0 is measured from the sensing elements, e.g. from the plane containing the sensing elements.

Moreover, the projection of the sensing element or elements over the hole is at a distance of at least 0.1 Wh away from the conductor (or in other words, from the inner edges of the hole).

In the following, sensors and the measurement of the magnetic field will be discussed relative to the positioning over the hole in the probing portion. In some embodiments, the sensor may be adapted to provide a signal based on one or more component of the magnetic field, for example based on parameters derived thereof. For example, in some embodiments, the sensing element or elements may include magnetic concentrators, e.g., integrated magnetic concentrators (IMC) for redirecting the field, or at least some components thereof, to the sensing portion (e.g., to a Hall plate).

In some embodiments of the present invention, the sensor may be adapted to provide a signal based on only one component of the field, for example the X component, Bx. In such embodiments, only a single sensing element may be needed in the sensor. This has an easy implementation and signal processing. In some embodiments, the single sensing element is centered with respect to the hole. This means that the sensor should be positioned so that the axis of the hole passes through the sensing element. In some embodiments, this position presents high symmetry of the field. In particular, measurement of the component Bx presents advantageously a high stability against mechanical tolerances as shown in the following. Such sensor 220 is shown in the particular embodiment of FIG. 7, which also shows an optional shielding 111 as discussed below.

Figure 3:
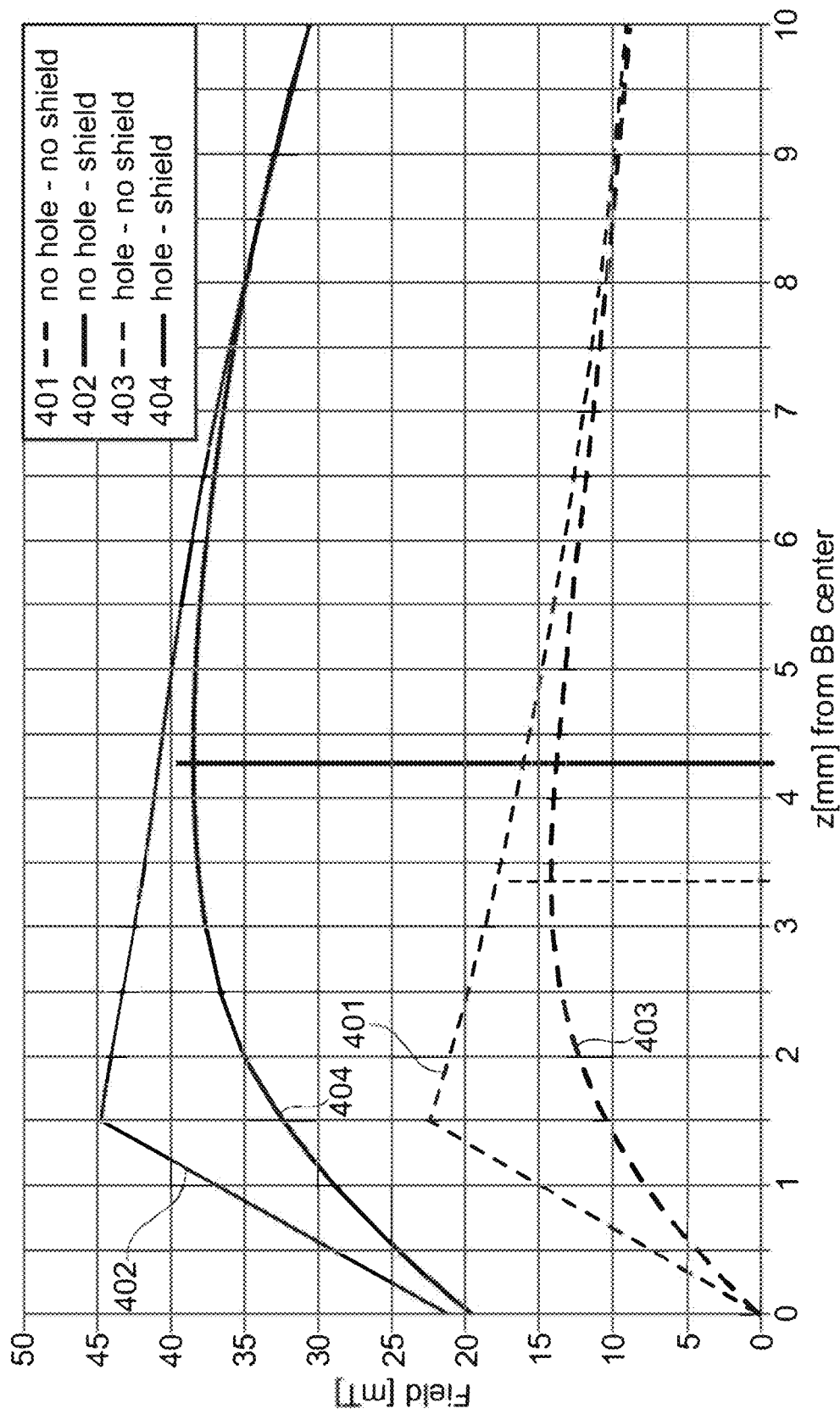
FIG. 3 is a graph of a component of the field (in mT) as a function of the distance of the sensor to the conductor, for the case of a conductor with no hole (shielded and unshielded) and for the case of embodiments of the present invention (shielded and unshielded).

FIG. 3 is a graph which shows, for four different configurations, the magnetic flux density (in mT) of the X component of the magnetic field, relative to the distance from the center of a conductor ($z=Z0+t/2$). The region between 0 and 1.5 mm corresponds to the inside of the bus bar, i.e., between 0 and t/2. For both shielded cases 402, 404, the graph shows lower maximum field at (or close to) the surface of the conductor. The graph 402 for no hole and shield shows a steady decrease with the distance at a similar rate as the graph 404 for the case of hole with shield. On the other hand, the graphs 401, 403 for the cases of conductor with a hole shows an increasing field from the surface, then a smooth maximum with shape of a plateau, followed by a decrease until the fields are similar as the ones with no hole, at a distance of approximately 8 mm. In the case of the shielded conductor with a hole, this plateau is reached at around 4 mm, and in the case of the unshielded conductor, the plateau is reached at around 3.5 mm (relative to the center of the conductor).

Thus, if the sensor is placed at around the plateau, there is leeway for the exact positioning of the sensing element, increasing the mechanical tolerances, improving repeatability and lifetime drift over the case with no hole. Less calibration is required than for the case of conductor with no hole, where a shift of half mm can result in several mT of change, for the same current. The stability region, where the field changes up to +/−4%, for example +/−3%, for example +/−2% with the positioning, can be obtained from the plateau. This stability region may extend for 2 mm, or 3 mm, or even more, e.g. up to 4 mm.

The discussion of FIG. 3 relates to the measurement of one field component, but the present invention is not limited thereto. For example, the sensor may be adapted to provide a signal derived from the field, for example derived from characteristics or parameters obtained from the field components, not the fields components per se. These types of measurement provide different advantages, for example less dependence on external noise or stray magnetic fields, thereby improving SNR.

In some embodiments of the present invention, the sensor may be adapted to provide a signal based on the difference (or gradient) of the Z component of the field, ΔBz, in two different positions. In such embodiments, two sensing element may be used. For example, the two sensing elements may be separated by a distance in the X direction. For example, the sensor of FIG. 2 includes a first sensing element 201 adapted to measure the Z component of the magnetic field in a first position, in the direction away from the conductor as indicated by the arrow, and a second element 202 may be adapted to measure the Z component of the field in a second position. The Z component of the field have opposite signs at the two positions, as shown by the arrows.

Figure 4:
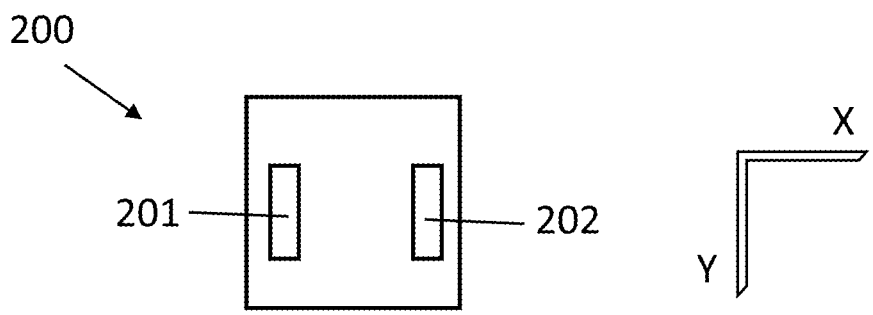
FIG. 4 illustrates a bottom view of a sensor adapted to measure the magnetic field gradient, for use in embodiments of the present invention.

FIG. 4 shows a detail of the sensor 200 of FIG. 1 and FIG. 2. The sensor includes two sensing elements 201, 202 in two different positions separated by a predetermined distance in the X direction, although the present invention is not limited to this configuration and they may be separated in different directions. The gradient of the field can be obtained as a difference of the field, for at least one component, between these positions. If required, each sensing element may include an IMC to properly redirect the relevant component of the field (e.g. the Bz component) towards the sensing portion of the element, from which the differential field can be obtained as a difference of the signals. The sensor (in particular the sensing area define before) is centered relative to the hole, as explained earlier. In some embodiments, the mid-point between the sensing elements is centered with respect to the hole. For example, in some embodiments, the sensing elements, e.g. Hall sensing elements, are separated between 1 mm and 3 mm, e.g. 1.5 mm or 2 mm, or 2.5 mm. for example by 1.8 mm. Both, however, can fit within the stability region simultaneously. By making the separation under 3 mm, the sensing elements can fit in a single IC.

Figure 5:
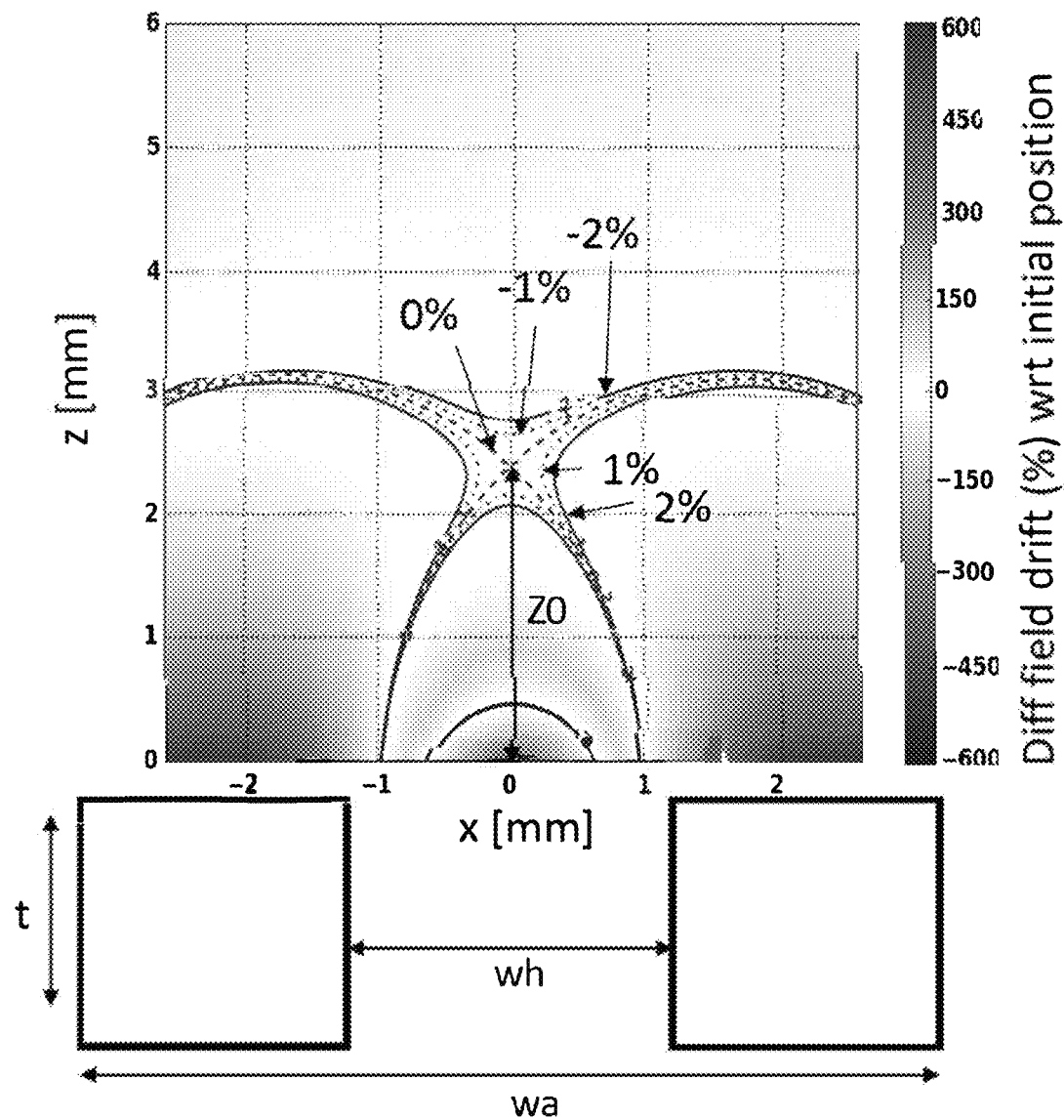
FIG. 5 illustrates the differential field drift relative to the distance of the sensor to the hole. It shows the distance at which there is a stability region where the signal variation due to positioning does not vary beyond 2%, for the cross section of the exemplary conductor as shown in FIG. 2.

FIG. 5 illustrates the differential field drift (in percentage) relative to the distance from the conductor surface plane (or the opening of the hole), for the cross section of the exemplary conductor as shown in FIG. 2. However, since FIG. 5 shows the change in the differential field with the coordinate of the mid-point between the sensing elements, in this example each sensing element of the differential pair is not within the stability region. The specific dimensions of the conductor in the cross section include a thickness of 2 mm, a hole width Wh of 2 mm and a conductor width of 7 mm (which means that the width of each part is 2.5 mm, assuming them equal). The stability region is at a distance Z0 of around 2.4 mm (the distance Z0 above the plane of the bus bar surface). The drifts are reduced to 2% maximum, for a dz variation of +/−0.5 mm within this region.

This means that a sensor adapted to provide the differential field (e.g. a sensor with a pair of sensing elements as shown in FIG. 4 and FIG. 2) should be placed at around 2.4 mm from the plane of the conductor surface facing the sensor, being the top surface. The position could vary up or down between 1.9 mm and 2.9 mm, and the drift would not vary more than 2%. This means that the positioning does not require a time-consuming and very accurate process. It also means that mechanical strain during the lifetime of the device (e.g. due to thermal expansion, vibration and such) will not result in serious drift.

Other types of sensors also benefit from the stability region. For example a sensor adapted to provide a signal based on one component (e.g. at least Bx) can also be placed in the stability region with a high mechanical tolerance, at least in the Z direction as shown in FIG. 3.

The distance Z0 is measured from the plane of the surface to the center of the stability region, but the size of the stability region depends on the type of sensing. In other words, the range of distances, at which the signal is stable relative to displacement, should be optimized taking into account the type of sensing also, and it is influenced by external factors such as shielding from stray magnetic fields. In general, the distance Z0 may be between half the hole width Wh and twice the hole width Wh, or for example between 0.75 times the hole width Wh and 1.5 times side hole width. In some embodiments, the distance Z0 between the sensing element or elements of the sensor and the conductor 101 is between 1 mm and 6 mm.

A compact design can be obtained for many conductor configurations, for many sensor types and with good mechanical stability.

For example, for a sensor adapted to provide a differential field in the Z direction, or for a sensor adapted to provide measurement of the field in the X direction, the range usually falls within 1 mm and 4 mm if the system has no special shielding against stray magnetic fields or the like. For the shielded version of the system with the sensor adapted to measure the field in the X direction, see below with reference to FIG. 7.

In some embodiments, the width of the hole is larger than or equal to the thickness of the conductor (e.g. the bus bar). This allows the hole to be provided by stamping.

Figure 6A:
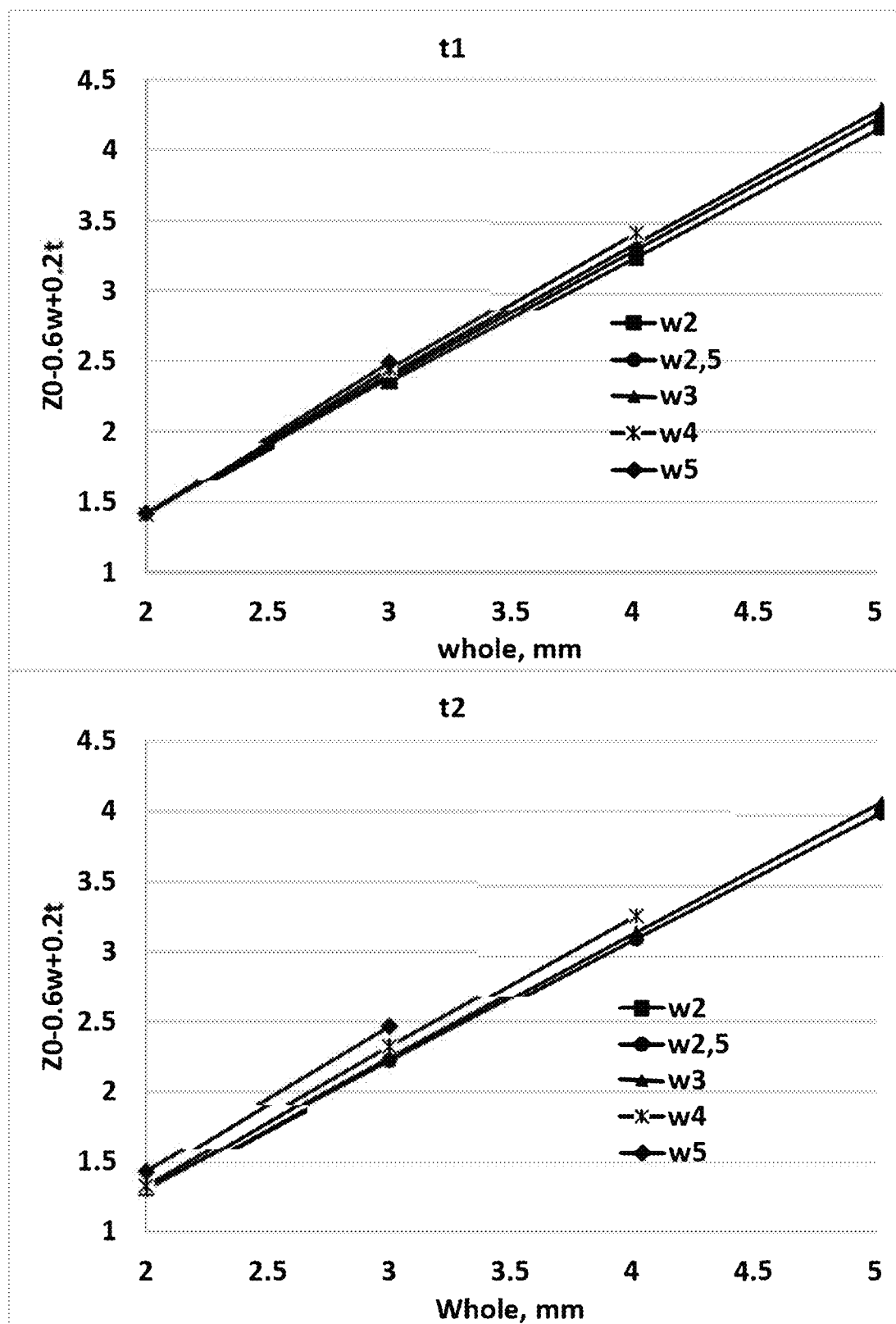
FIGS. 6A and 6B are graphs of the linear relationship between the distance to the stability region and the geometry of the conductor and its hole, in accordance with embodiments of the present invention.
Figure 6B:
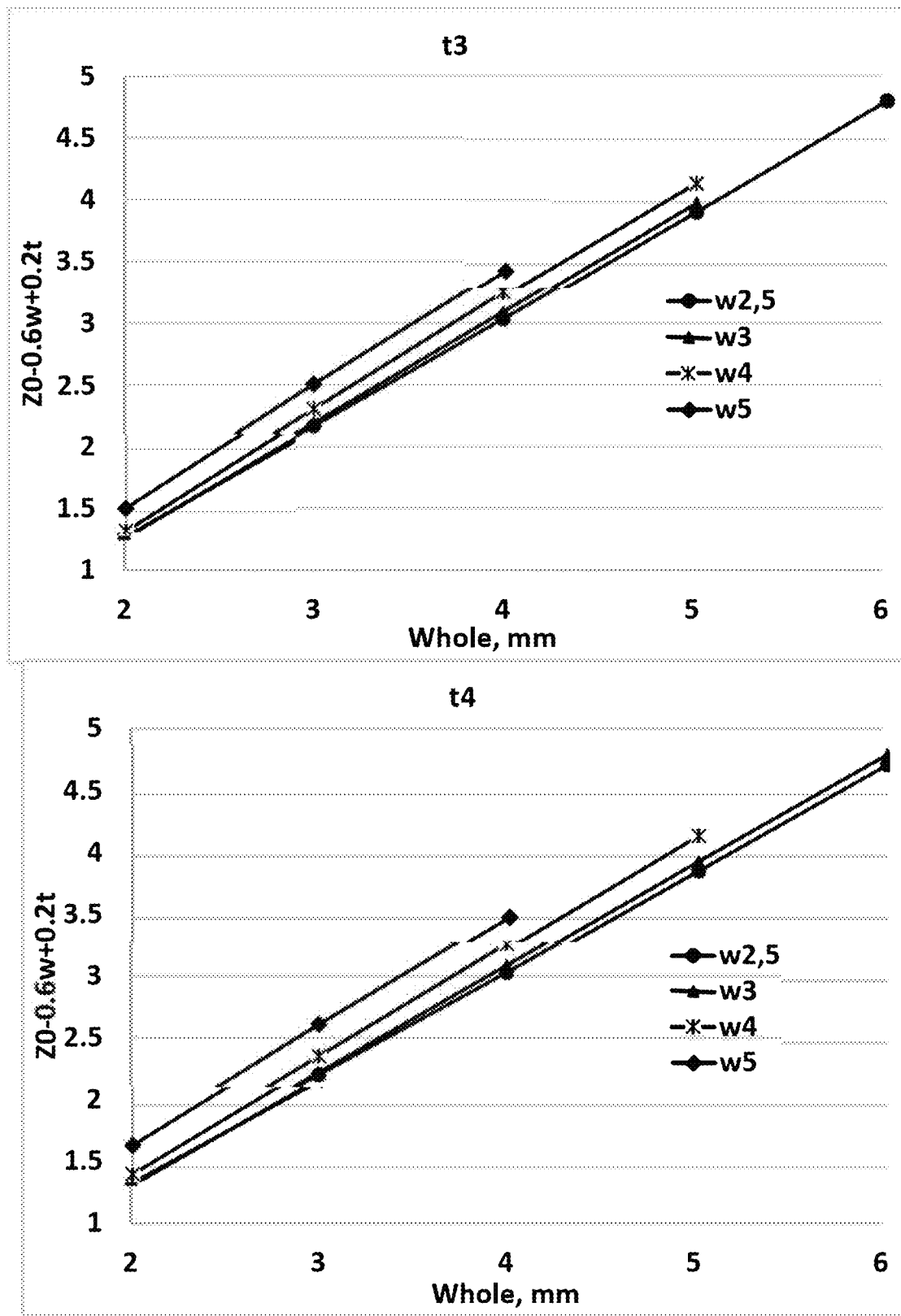

The values of the distance Z0 to the stability region can be linked to the geometry of a bus bar with width W, thickness t and a hole with a hole width Wh. It has been found that the relationship between the geometry of the bus bar and the distance Z0 follows a linear relationship for the same material:

$$Z0 \sim 0.6W + 0.2t = a*Wh + b$$

where a and b are two constants, and where the factors of 0.6 and 0.2 apply to a Bz differential sensor. However, other values may apply (for example, different values will apply for Bx sensing). The spacing between the sensing elements is fixed, the rest of the parameters of the conductor geometry are adapted, as shown in FIG. 6.

This relationship can apply to a sensing system where the sensor is for example adapted to provide the gradient of Bz (and/or the difference of Bz between two positions, ΔBz). This is shown in FIG. 6 as a function of the hole width Wh, in a range between 2 mm and 5 mm. Each graph represents a different thickness and part width w value, where the part width w value is the same for each opposite parts of the conductor, hence the width of the conductor can be calculated as Wa=2w+Wh. The values of thickness vary between 1 mm and 4 mm, while the ranges of part widths vary between 2 mm and 5 mm, including 2.5 mm, 3 mm and 3.5 mm.

The relatively large gap and distance Z0 between the conductor and the sensor (or between the center of the conductor and the sensor, minus half the thickness of the conductor) reduces the SNR. Despite this, the present invention improves the gain stability relative to mechanical tolerances. It could be used to avoid sensor sensitivity to positioning and reduce calibration requirements (e.g. avoid over-current detection threshold recalibration) on the production line (thus improving static mechanical tolerances). It also reduces the impact of vibration and lifetime mechanical drift (thus improving dynamic mechanical tolerances).

Figure 7:
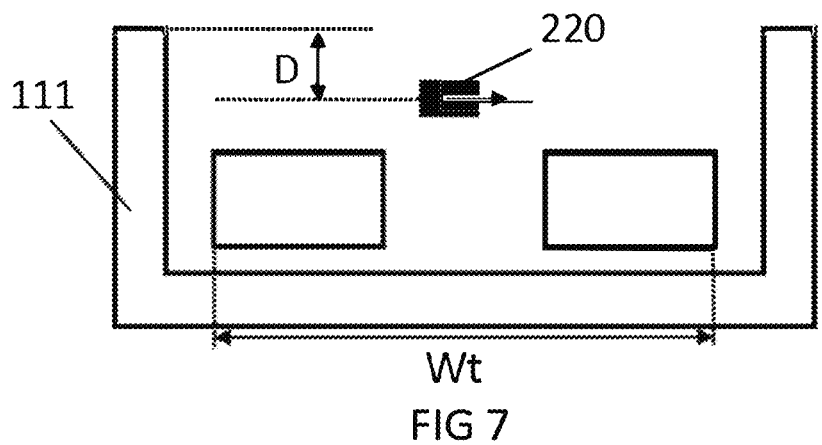
FIG. 7 illustrates a cross section of the probing portion of a shielded conductor, including different sensors, in accordance with embodiments of the present invention.

In some embodiments, magnetic shielding means are included, to reduce the influence of external fields in the region between the sensor and the conductor. In some embodiments, the shielding means include a ferromagnetic shield around the conductor and the sensor, for example a U-shaped ferromagnetic shield as shown in FIG. 7. For example, the sensor 200, 220 may be placed between the opening of the U-shaped shield 111 (the top open part of the 'U' shape) and the conductor, at a predetermined distance Z0 from the opening of the hole 102 and at a sufficient distance D from the opening of the shield 111 so the shielding is effective. The preferred minimum distance may be 3 mm, for example 4 mm or 5 mm. For example the distance D may be between 5 mm to 10 mm, for example 6 mm, or 7 mm, or 8 mm. The U shape may have a total height typically between 10 mm and 20 mm, for example 12.5 mm or 15 mm. The sensor is typically located at half the height, approximately. Other shapes can be used, for example the shield may wrap around the sensor. In some embodiments, the ferromagnetic shield 111 comprises mu-metal. The present invention is not limited thereto, and other types of shielding can be used.

FIG. 7 shows a sensor 220 with a single sensing element. The sensor is adapted to measure one component of field (for example, the field flux), e.g., the X component (as indicated by the arrow), in a single position. The sensing element may include means for redirecting the field lines, e.g., a magnetic concentrator, such as an IMC as indicated earlier. The characteristics of the sensor and the shielding may provide a wider stability region (for the specific measurement of one component, e.g., of the field in the X component) than for the unshielded system. In some embodiments, the distance Z0 to the conductor (as defined earlier) may reach up to 6 mm. In some embodiments, Z0 may be chosen as half of the whole width to up to twice the hole width (between 0.5 Wh and 2 Wh).

In embodiments of the present invention, the system of the present invention the conductor carries alternating currents (AC). The inventors found that at least one component of the field is robust against frequency-dependent attenuation. Hence, in embodiments of the present invention, the SNR of the sensing system can advantageously be invariant relative to the frequency, or at least less affected than with other existing solutions.

Figure 8:
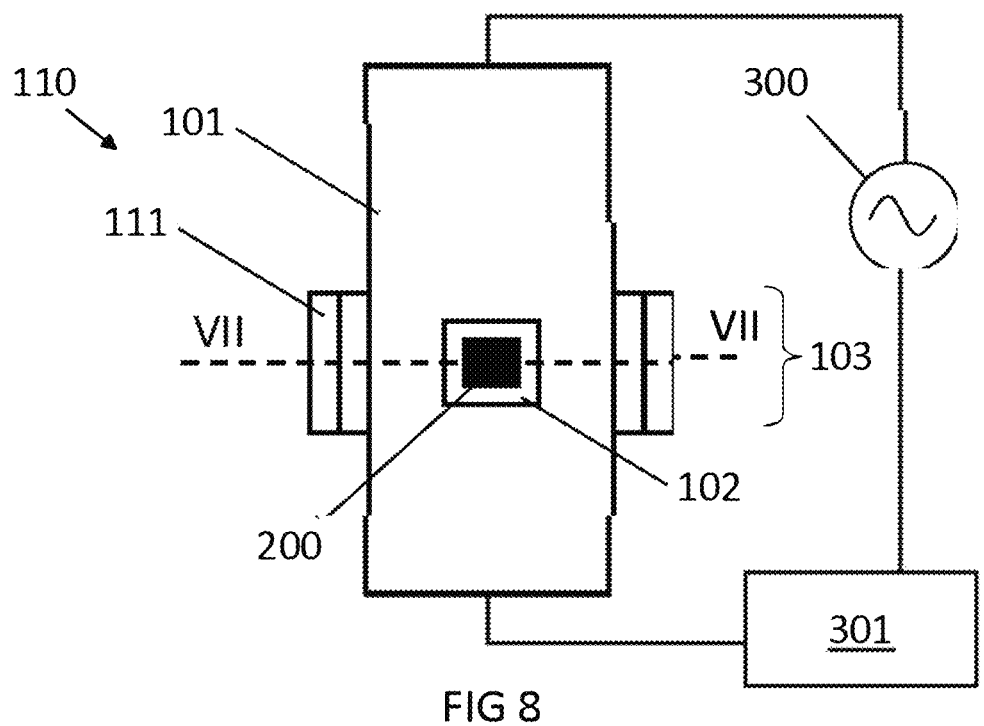
FIG. 8 illustrates the bottom view of a system in accordance with embodiments of the present invention, including an AC source.

FIG. 8 shows a conductor 101 which carries alternating currents, and the sensor is adapted to provide reading of the AC. The sensor 200 may be adapted to provide gradient of the field in the Z direction. The present invention is not limited thereto, and the sensor may be a sensor 220 adapted to detect the field in one component, e.g., as the sensor 220 shown in FIG. 7. The current source may provide a frequency of e.g., at least 100 Hz, for example above 1 kHz, above 10 kHz, even above 100 kHz. The conductor can be coupled to an AC source 300 which may be any suitable source, which may be connected to, e.g., in contact with, the conductor, e.g. a bus bar. The conductor 101 is connectable also to a load 301 so the load receives the alternating current through the conductor 101.

Additionally to the AC source, in some embodiments, the probing portion includes shielding. This reduces the influence of stray fields. It also proved advantageous for AC applications (measuring of intensity of AC), as attenuation and phase shift can be reduced. The advantages of the configuration of the present invention, together with prior art configurations, are explained with basis on the following graphs of FIG. 9, for a conductor portion being a bus bar with 3 mm thickness and 12 mm width for the prior art, no-hole case, and for a conductor portion having the same geometry and a 3 mm wide hole in the center of the conductor (so two conductor parts are provided at each side of the hole with the same cross section). The shield influence is studied for each case.

Figure 9:
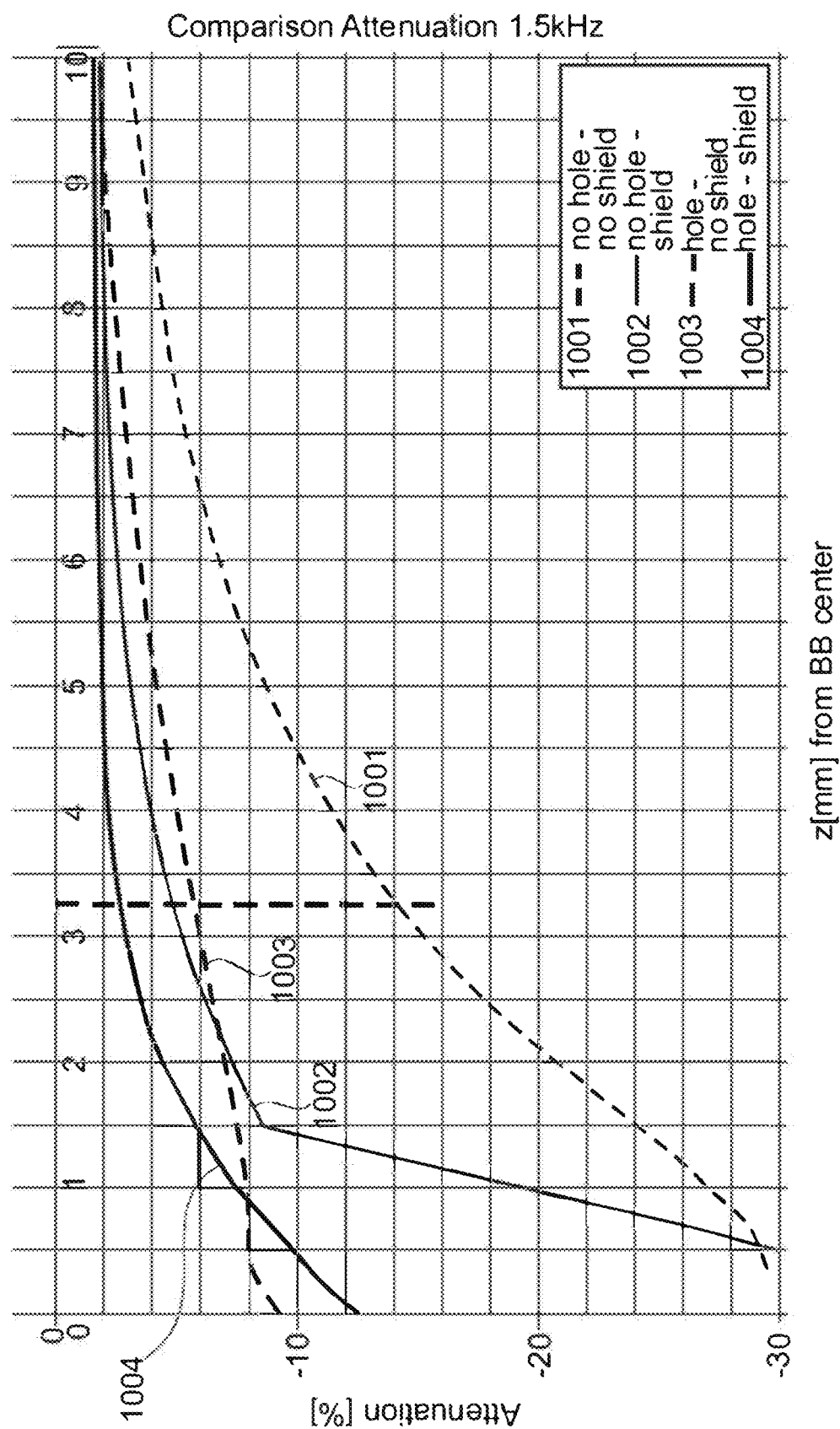
FIG. 9 is a graph of the attenuation for an AC with a frequency of 1.5 kHz, for a shielded and unshielded conductor with no hole, and for a shielded and unshielded conductor with a hole in accordance with embodiments of the present invention.

FIG. 9 is a graph which shows, for four different configurations, the attenuation (in percentage) of the magnetic field when the frequency of the AC is 1.5 kHz, as a function of the distance from the center of the conductor ($z=Z0+t/2$). The region between 0 and 1.5 mm corresponds to the inside of the bus bar, i.e., between 0 and t/2. The graph 1001 for the prior art systems with no hole and no shield show a slow increase towards no attenuation (since attenuation is negative) beyond 10 mm. The graph 1002 for no hole and shield shows attenuation at similar rate as the for the graph 1003 for hole and no shield, however this last case shows a more linear increase. The graph 1004 for the case of hole and shield shows a fast increase towards no attenuation close to 4.5 mm. The repeatability with respect to mechanical tolerances is improved over the case with no hole. Thus, it is possible to obtain an overlapping region where there is simultaneously stability relative to the exact positioning of the sensor, and a region of very low attenuation. The graph also shows that the dependance of attenuation at 1.5 kHz with the mechanical displacement can be attenuated at the location of the dotted lines, so the attenuation changes less with mechanical displacement compared with the no-hole situation). The derivative is smaller as compared to the no-hole situation.

Figure 10:
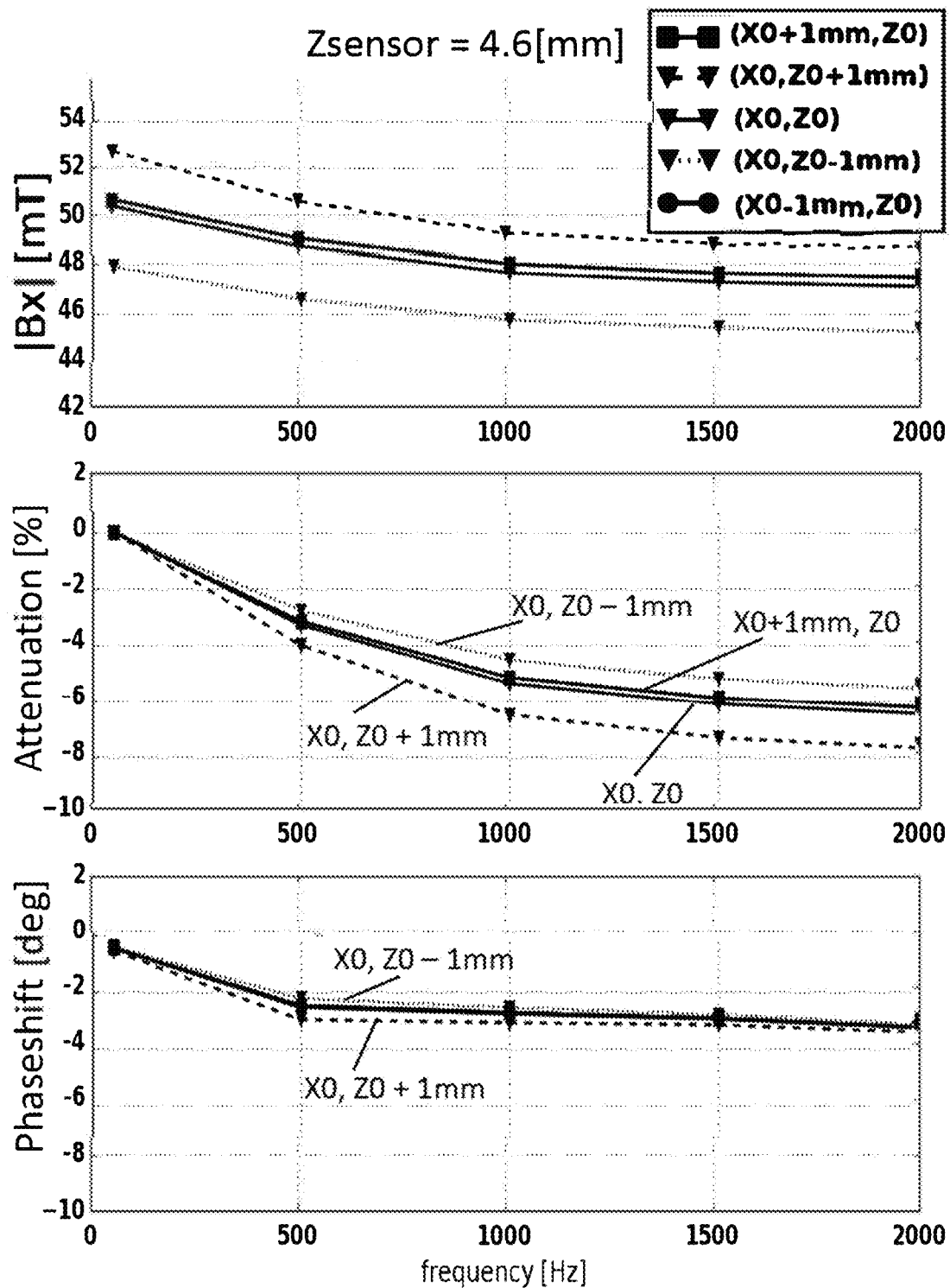
FIG. 10 shows three graphs with the behavior of the field, attenuation, and phase shift with frequency for an alternating current, for a shielded conductor with no hole.
Figure 11:
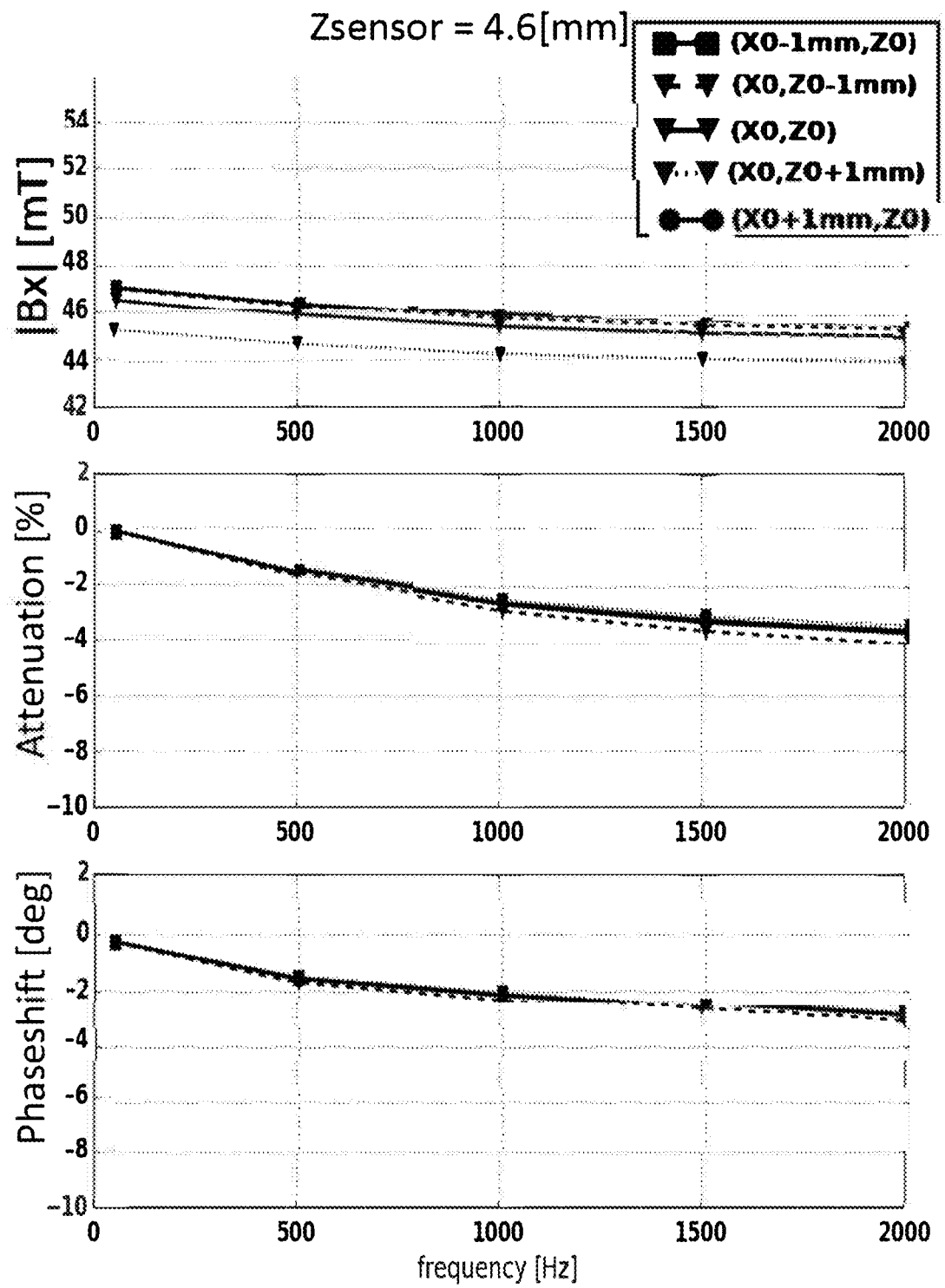
FIG. 11 shows three graphs with the behavior of the field, attenuation, and phase shift with frequency for an alternating current, for a shielded conductor with a hole in accordance with embodiments of the present invention.

FIG. 10 and FIG. 11 show the frequency dependence for a shielded system with a sensor adapted to measure one magnetic field component (e.g. Bx), for a prior art configuration in FIG. 10, and for the present invention in FIG. 11. In particular, FIG. 10 shows simulations of the frequency change of several parameters for a shielded system where the conductor has no hole. In the top graph, the change of the field in mT with frequency (Hz) is shown for 5 different position displacements. The largest difference is approximately 5 mT due to the different positioning. The middle graph shows the change of attenuation in percentage for five different positionings. The difference increases with the frequency. For the lowest change, at a displacement of −1 mm in the Z direction, the attenuation drops to −6% with frequency, and for the displacement of +1 mm in the Z direction, the attenuation drops to almost −9% with frequency. The lowest graph shows the phase shift in degrees with the frequency, for the same five different positions. The largest difference, as before, is seen between the −1 mm and +1 mm displacement in the Z direction, while the displacement in the X direction has less relevance. The largest shifts occur at high frequencies, close to 4 degrees for the positive 1 mm displacement in the Z direction, while for the negative 1 mm displacement, the largest shift (at around 2 kHz) is close to 3 degrees.

FIG. 11 shows the simulation results, for a shielded system where the conductor has a hole in accordance with embodiments of the present invention, with otherwise the same conditions (frequency of the current, displacements) as in FIG. 10. The field is almost the same no matter the displacement (top graph). The attenuation, shown in the middle graph, is average, increasing with frequency from 0 to −3% for 2 kHz, but the repeatability is very high in AC relative to mechanical displacements. The attenuation, in the lowest graph, improves slightly (around half a degree over the best-case scenario of the conductor with no hole), but the repeatability is also largely improved, since the attenuation is almost the same for all the displacements.

In a further aspect, the present invention provides a kit of parts including a conductor 101 comprising a hole 102 in accordance with the first aspect of the present invention, and a sensor for contactless sensing of the magnetic field generated by the conductor in the conductor portion 103 being a probing portion, comprising the hole.

The kit may comprise a substrate 210 where the sensor 200 can be provided, or to which the sensor is attached. The substrate may be a PCB.

Since the shape, size and distance of the stability region depends on the geometry of the probing portion, it is possible to provide a pre-calibrated guiding and positioning system for positioning the sensor. In some embodiments of the present invention, the kit of parts may include a guiding system, for example a separate system or a system integrated in the conductor or in the sensor, or in the PCB, for allowing an easy positioning of the sensor, so the sensing elements are within a stability region over the hole.

In some embodiments, the kit comprises connectors to a source, such as an AC source.

In some embodiments, the kit may comprise a shielding system, e.g. a shielding plate, e.g. shaped shielding plate (with e.g. a U-shape, or wrapping the sensor or the like), e.g. the plate may be a metal plate, e.g. mu-metal.

The shielding system and the positioning system may be integrated or attached one to the other, to obtain good positioning of all the elements relative to each other. The substrate and the shield may be adapted to fit into one another, for example the PCB may include attachment means (holes, slots, clips or the like) to fix the shield in position.

In a further aspect, the present invention provides a method of measuring currents through a conductor by use of the system of the present invention. The method comprises providing a conductor, forming a hole in the conductor to obtain a conductor 101 with a hole 102 as described in embodiments of the first aspect of the present invention, and positioning a magnetic sensor including one or more magnetic sensing elements over the hole. For example, the currents being measured may be AC.

In some embodiments of the present invention, the method includes providing the hole by stamping. This is a simple and fast way of providing the hole, faster than e.g., cutting or drilling. Typical bus bar geometry, where the width Wa and the width w of each part around the hole of the bus bar is larger than the thickness t, can be easily stamped, to provide a hole with a width Wh larger than the thickness t of the conductor (thus, w> t, Wh> t).

The positioning is performed so that the sensing area of the sensor is inside the stability region formed at a predetermined distance Z0 from the plane of the conductor (or at a distance Z0+t/2 from the center of the conductor, where t is the thickness of the conductor), or at least the center of the sensing area is within the stability region. In some embodiments the magnetic sensing elements are placed within the stability region.

The method can be applied to the measurement of currents in an electrical motor, for example measurement of the phase current in e.g., 3-phase systems. In this case, the AC is usually generated by an inverter.

The invention claimed is:

1. A sensing system for contactless sensing of current passing through a conductor, the sensing system comprising:
   a conductor for generating a magnetic field as electric current flows through the conductor, the conductor having a predetermined width and comprising a hole with a predetermined hole width passing through the whole thickness of the conductor, and
   a differential magnetic sensor for measuring at least one component of the magnetic field generated by the conductor,
   wherein the sensing system is configured to sense current on the basis of a difference of the measured magnetic field measured at two different positions,
   wherein the magnetic sensor overlaps the hole,
   wherein the magnetic sensor is positioned at a predetermined distance over the plane of a top surface of the conductor,
   wherein an axis is defined at the center of the hole passing through the thickness thereof and the magnetic sensor is centered over the axis of the hole,
   wherein the width of the hole is at least 0.15 times the width of the conductor.

2. The sensing system of claim 1, wherein the magnetic sensor includes at least one magnetic sensing element.

3. The sensing system of claim 1, wherein the magnetic sensor comprises a molded integrated circuit and leads, where the molded integrated circuit is separately provided over the conductor.

4. The sensing system of claim 1, wherein the magnetic sensor is positioned between 1 mm and 6 mm away from the conductor.

5. The sensing system of claim 1, wherein the magnetic sensor is adapted to measure a difference of the field between two different positions.

6. The sensing system of claim 5, wherein the magnetic sensor is adapted to measure a difference of the field between two positions in perpendicular direction with respect to the surface of the conductor.

7. The sensing system of claim 5, wherein the magnetic sensor further comprises at least two sensing elements distanced within a plane parallel to the conductor, the central axis of hole passing through the mid-point between the two sensing elements.

8. The sensing system of claim 1, further comprising a magnetic shield at least partially surrounding the conductor portion comprising the hole.

9. The sensing system of claim 8, wherein the magnetic shield has a U-shape.

10. The sensing system of claim 1, wherein the sensing system is adapted to provide reading of alternating current.

11. The sensing system of claim 1, wherein the hole is centered with respect to the conductor cross section.

12. The sensing system of claim 1, wherein the conductor has a rectangular cross section and a thickness of 1 mm up to 5 mm.

13. The sensing system of claim 12, wherein the conductor has a width between 3 mm and 20 mm.

14. The sensing system of claim 1, wherein the magnetic sensor comprises a first sensing element and a second sensing element.

15. A method of measuring current through a conductor, the method comprising:
   providing a hole through the conductor;
   providing a differential magnetic sensor overlapping the hole at a predetermined distance from the hole opening,
   wherein an axis is defined at the center of the hole passing through the thickness thereof and the magnetic sensor is centered over the axis of the hole,
   wherein providing the hole comprises providing the hole with a width of at least 0.15 times the width of the conductor, and
   where the current sensing is done on the basis of the difference of the measured magnetic field measured at two different positions.

16. The method of claim 15, wherein providing the hole comprises stamping the conductor.

17. The method of claim 15, wherein the magnetic sensor comprises a first sensing element and a second sensing element.

* * * * *